United States Patent
Wile et al.

(10) Patent No.: US 8,242,813 B1
(45) Date of Patent: Aug. 14, 2012

(54) ADAPTIVE NON-POSITIVE INDUCTOR CURRENT DETECTOR (ANPICD)

(75) Inventors: Donald Wile, San Jose, CA (US); Andrew Wu, Campbell, CA (US)

(73) Assignee: Adaptive Digital Power, Inc., San Jose, CA (US)

(*) Notice: Subject to any disclaimer, the term of this patent is extended or adjusted under 35 U.S.C. 154(b) by 88 days.

(21) Appl. No.: 12/889,185

(22) Filed: Sep. 23, 2010

Related U.S. Application Data

(60) Provisional application No. 61/278,108, filed on Oct. 5, 2009, provisional application No. 61/278,109, filed on Oct. 5, 2009, provisional application No. 61/278,127, filed on Oct. 5, 2009, provisional application No. 61/278,128, filed on Oct. 5, 2009, provisional application No. 61/278,129, filed on Oct. 5, 2009, provisional application No. 61/278,107, filed on Oct. 5, 2009.

(51) Int. Cl.
*H03K 3/00* (2006.01)
(52) U.S. Cl. ......... 327/110; 327/108; 323/284; 323/285
(58) Field of Classification Search .................. 327/110, 327/108
See application file for complete search history.

(56) References Cited

U.S. PATENT DOCUMENTS

| | | | |
|---|---|---|---|
| 5,912,552 A * | 6/1999 | Tateishi | 323/285 |
| 6,310,469 B1 * | 10/2001 | Bentolila et al. | 323/283 |
| 7,061,213 B2 | 6/2006 | Yoshida | |
| 7,173,403 B1 | 2/2007 | Chen et al. | |
| 7,633,278 B2 * | 12/2009 | Ohtake | 323/282 |
| 7,675,276 B2 | 3/2010 | Ohkawa et al. | |
| 7,852,056 B2 * | 12/2010 | Nishida | 323/282 |
| 7,855,864 B2 * | 12/2010 | Andruzzi et al. | 361/91.1 |
| 7,973,523 B2 * | 7/2011 | Cheng | 323/284 |
| 2005/0057238 A1 | 3/2005 | Yoshida | |
| 2006/0050449 A1 * | 3/2006 | Wu | 361/18 |
| 2007/0279024 A1 * | 12/2007 | Falvey et al. | 323/280 |
| 2008/0130325 A1 | 6/2008 | Ye | |
| 2009/0079410 A1 | 3/2009 | Ohkawa et al. | |
| 2009/0102444 A1 | 4/2009 | Nonaka | |
| 2009/0315523 A1 | 12/2009 | Kumagai et al. | |
| 2010/0066328 A1 | 3/2010 | Shimizu et al. | |
| 2010/0102788 A1 | 4/2010 | Kuroyabu et al. | |

* cited by examiner

*Primary Examiner* — Ryan Jager
(74) *Attorney, Agent, or Firm* — Tran & Associates

(57) ABSTRACT

Systems and methods are disclosed to detect current for an output load with an inductor. The system includes a high side power transistor a low side power transistor coupled to the high side power transistor; and a controller coupled to the high and low side power transistors to provide cycle by cycle conduction of the low side power transistor, said controller adaptively turning off the low side power transistor when the high and low side power transistors are off and an inductor current is non-positive. Adaptation of the turn off of the low side transistor is based on the time position of the detection of the non-positive inductor current and serves to improve the power efficiency of the system.

20 Claims, 8 Drawing Sheets

ADAPTIVE NON-POSITIVE INDUCTOR CURRENT DETECTOR (ANPICD)

This application claims priority to U.S. Provisional Application Ser. Nos. 61/278,107; 61/278,108; 61/278,109; 61/278,127; 61/278,128; and 61/278,129, all of which were filed on Oct. 5, 2009, the contents of which are incorporated by reference.

BACKGROUND

The present invention relates to systems and methods for adaptive non-positive inductor current detection.

Discontinuous operation occurs in circumstances of light load when using a non-synchronous buck regulator. In the case of a synchronous buck regulator, optimizing the efficiency of the regulator, with light load, requires turning off the Low Side power transistor for a portion of the switching cycle. In this circumstance, the Low Side power transistor is disabled for one switching cycle after the cycle in which the inductor current has reversed direction or has zero volts across the inductor prior to turning on the High Side power transistor. Turning off the Low Side power transistor in this circumstance improves the light load efficiency by preventing needless discharge of the output capacitor and by reducing the switching losses due to turning on and off the NFET. Determination is made during the time the Low Side power transistor is off and prior to the turn on of the High Side power transistor, by sensing the voltage polarity across the Low Side Body diode. Ideally the Low Side power transistor is shut off and held off (for the remainder of the switching cycle) when the inductor current reverses. However with light loads, there are still significant efficiency benefits, if the Low Side power transistor is held off for the entirety of the switching cycle (as opposed to only a portion of the switching cycle). In this case the buck regulator is operating non-synchronously.

FIG. 1 shows a conventional implementation for turning off the Low Side power transistor, represented by "NFET" 14, in the circumstance when negative current in the inductor is present. Negative inductor current is defined as current flowing from the inductor into either the high or low side power transistors. FET 18 is a pull up and is connected between VDD and NFET 14. If negative current is not present in inductor 20 then the output of comparator 30 is LOW and flip flop (FF) 10 is SET when NFET 14 control goes HIGH. In this case, the Low Side power transistor is turned on as both inputs to AND 12 are asserted HIGH. If after the Low Side power transistor is on, the current in inductor 20 goes negative, comparator 30 output goes HIGH and is sent to AND 40 when NFET control is high, thus resetting FF 10 and forcing the Q output LOW, thereby shutting off the NFET 14.

In the circuit of FIG. 1, detection of negative current occurs while the Low Side power transistor is turned on. Low Side power transistor on resistance is typically very low (a few millions) for optimal efficiency. As such the voltage generated (due to negative inductor current) at the input to the comparator can be very small (in the order of a few mille volts) particularly since it is important to detect small negative currents (for optimal efficiency).

Small input voltages to the comparator are problematic in two regards:

1. Input offsets to the comparator can cause erroneous operation
2. Small overdrive typically translates to slow comparator response time.

Overcoming these two issues greatly complicates the design and efficiency gain of the implementation of FIG. 1. Overcoming the offset issue forces the comparator 30 to be implemented with either large input structures or switch capacitor techniques either of which require more die area. Often a known comparator offset is introduced to swamp out the random offset. This fixed offset forces the detected negative current to be larger than would otherwise be necessary, thereby degrading the efficiency of the circuit. The small overdrive forces the current burned in the comparator to be high in order to speed up the circuit. This in turn degrades the efficiency of the circuit. Moreover, the NPICD can experience a power loss from the body diode of the LOW SIDE power transistor for a portion of the switching cycle. The power loss is the product of the current through the body diode times the forward diode voltage drop.

SUMMARY

In one aspect, systems and methods are disclosed for an adaptive current detector for an output inductor from a switched voltage output of a switching regulator with a high side power transistor; a low side power transistor; an inductor coupled to the high and low side power transistors; and a detector asserting a first signal indicating when the high and low side power transistors are off and an inductor current is non-positive, wherein the detector asserts a second signal when the first signal is asserted within a predetermined period of when the low side power transistor turns off, and wherein the second signal is used in an adaptive loop to adjust when the low side transistor is turned off in subsequent switching cycles.

Implementations of the above aspect can include one or more of the following. The detector adapts an on-time of the low side power transistor in response to a load current in the inductor. Adaptation of the on-time is accomplished by extending or shortening the time between the turn off or turn on of the low side power transistor relative to the turn on of the high side power transistor, in response to the sensed direction of current in the output inductor. The adaptation of the on time of the low side power transistor improves switching regulator efficiency. The second signal is generated by a logic gate coupled to the first signal and a pulse generator supplying a pulse width for the predetermined period. An integrator can receive the second signal and asserts control of when the low side power transistor turns off, wherein the integrator reduces or increases an output voltage when each second signal is asserted. In some implementations the integrator can be an operational amplifier or can be an up/down counter. A timer can be connected to the low side power transistor to incrementally adjust when the low side power transistor is turned on or off. In some implementations the timer can be a ramp generator or can be a counter. A comparator can turn off the low side power transistor. In some implementations the comparator can be a counter coupled to a timer having a timer count output and wherein the comparator turns off the low side power transistor when the counter output exceeds the timer count output. Logic connected to the comparator output can control the turn on and turn off of the low side power transistor. The low and high side power transistors can be field effect transistors (FETs) and wherein each FET is coupled to a body diode.

In another aspect, a current detector for an output inductor includes a high side power field effect transistor (FET); a low side FET coupled to the high side FET; means for asserting a first signal indicating when the high and low side power transistors are off and an inductor current is non-positive; means for asserting a second signal when the first signal is asserted within a predetermined period of when the low side power transistor turns off; and an adaptive loop using the second signal to adjust when the low side transistor is turned off in subsequent switching cycles.

Implementations of the above aspect can include one or more of the following. The circuit can include means for determining when said control means is active within a predetermined period when the low side power transistor turns off; means for integrating the output of said determining means; timer means for incrementally adjusting when the low side power transistor is turned on or off; and means for comparing the integrating means with the timing means and turning off the low side power transistor in response to the comparing means.

In a further aspect, an adaptive current detector for an output inductor from a switched voltage output of a switching regulator includes a high side power transistor; a low side power transistor; an inductor coupled to the high and low side power transistors; a detector asserting a first signal indicating when the high and low side power transistors are off and an inductor current is non-positive; and a controller coupled to the detector and the high and low side power transistors to provide control of the cycle by cycle conduction of the low side power transistor, the controller utilizing an adaptive loop using the second signal to adjust when the low side transistor is turned off in subsequent switching cycles. Implementations of the above aspect can include one or more of the following. The controller asserts a second signal when the first signal is asserted within a predetermined period when the low side power transistor turns off. The controller adaptively turns off the low side power transistor in response to a time position of the first and second signals. The system can include a detector to determine when non-positive inductor current is present within a predetermined period of when the low side power transistor turns off; an integrator coupled to the detector; a timer to incrementally adjust the timing when the low side power transistor is turned on or off; and a comparator coupled to the timer and the integrator, wherein the comparator output turns off the low side power transistor.

Advantages of the preferred embodiments may include one or more of the following. In the discontinuous mode of operation, the ANPICD reduces power loss from the body diode of the LOW SIDE power transistor for a portion of the switching cycle. The power saved is the product of the current through the body diode times the forward diode voltage drop. During the portion of the switching duty cycle the high side power transistor is off, the ANPCID turns on the low side power transistor for the portion of the cycle the inductor current is positive, and turns off the low side power transistor when the inductor current reaches zero. Thus, regulator efficiency is improved by shutting off the low side power transistor at the appropriate time. The low side power transistor body diode conducts (if the low side power transistor is off), during the time that the inductor current is positive. If the low side power transistor is turned on for the period of time that the low side power transistor body diode would conduct and the low side power transistor is turned off at the inductor current zero cross point, then the regulator will be operating at optimal efficiency. The time position of the start of the WU signal, relative to when the high side power transistor shuts off, is an accurate gauge of how long the LOW SIDE power transistor should stay on in order to operate most efficiently. The ANPICD provides an effective means to determine when to turn off the Low Side power transistor to optimize efficiency. It does this by determining when the current in the inductor reaches zero or goes negative (i.e. is non-positive) without the need for detecting the small voltages as conventionally required. As such the design, power requirements and offset sensitivity of the comparator are greatly improved as well as the overall efficiency of the regulator. Rather than detecting the zero current condition while the LOW SIDE power transistor is on, the ANPICD detects this condition during the dead time when both the High Side and Low Side power transistors are off.

DESCRIPTION

An effective system to determine when to turn off a Low Side power transistor to optimize efficiency is disclosed in commonly owned, concurrently filed and co-pending application Ser. No. 12/889,166 entitled "Non-Positive Inductor Current Detector (NPICD)", the content of which is incorporated by reference. As taught therein, the NPICD determines when the current in the inductor reaches zero or goes negative (i.e. is non-positive) without the need for detecting the small voltages as conventionally required. As such the design, power requirements and offset sensitivity of the comparator are greatly improved as well as the overall efficiency of the regulator. Rather than detecting the zero current condition while the Low Side power transistor is on, the NPICD detects this condition during the dead time when both the High Side and Low Side power transistors are off.

Figure 1:
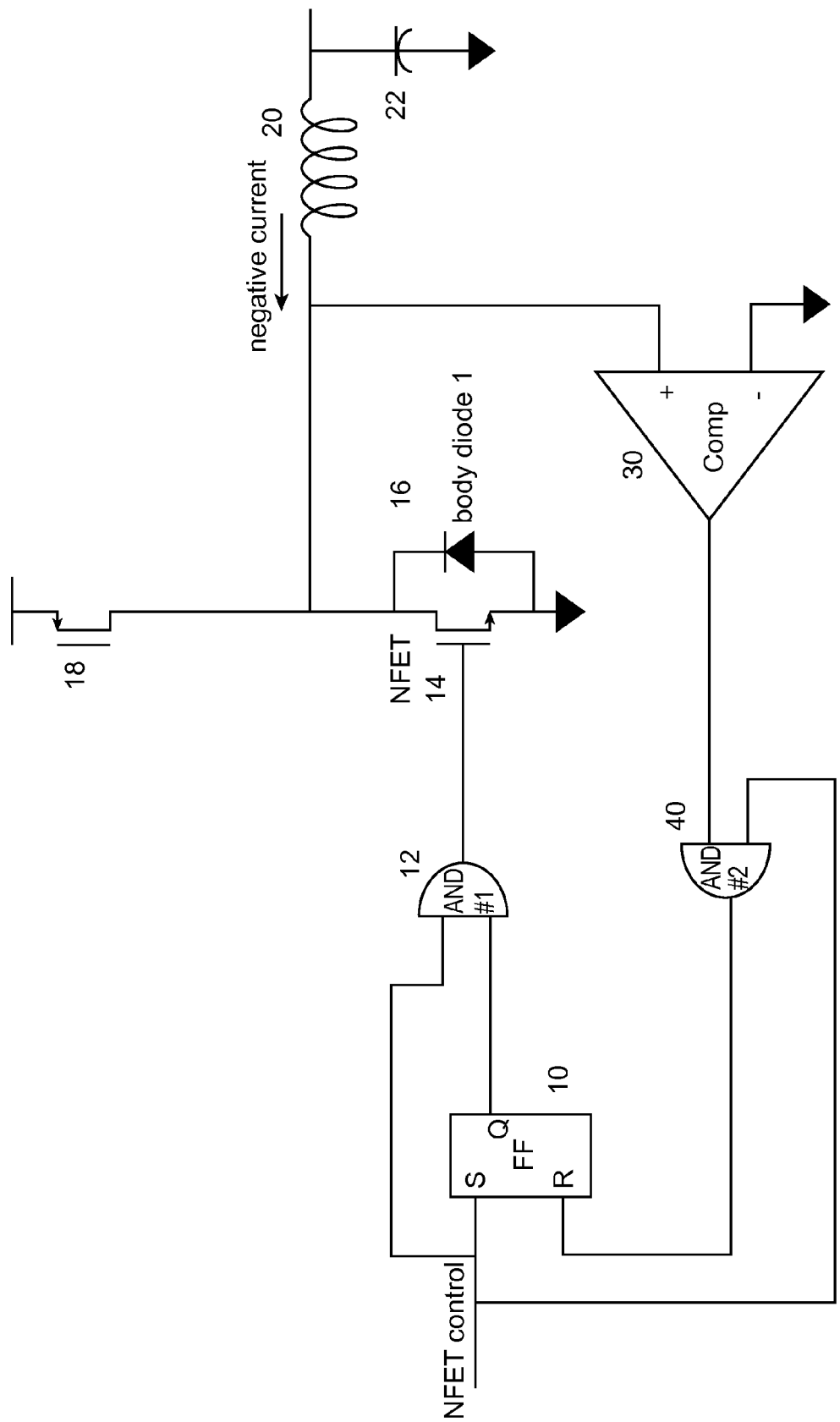
FIG. 1 shows a conventional implementation of an inductor current detector.
Figure 2A:
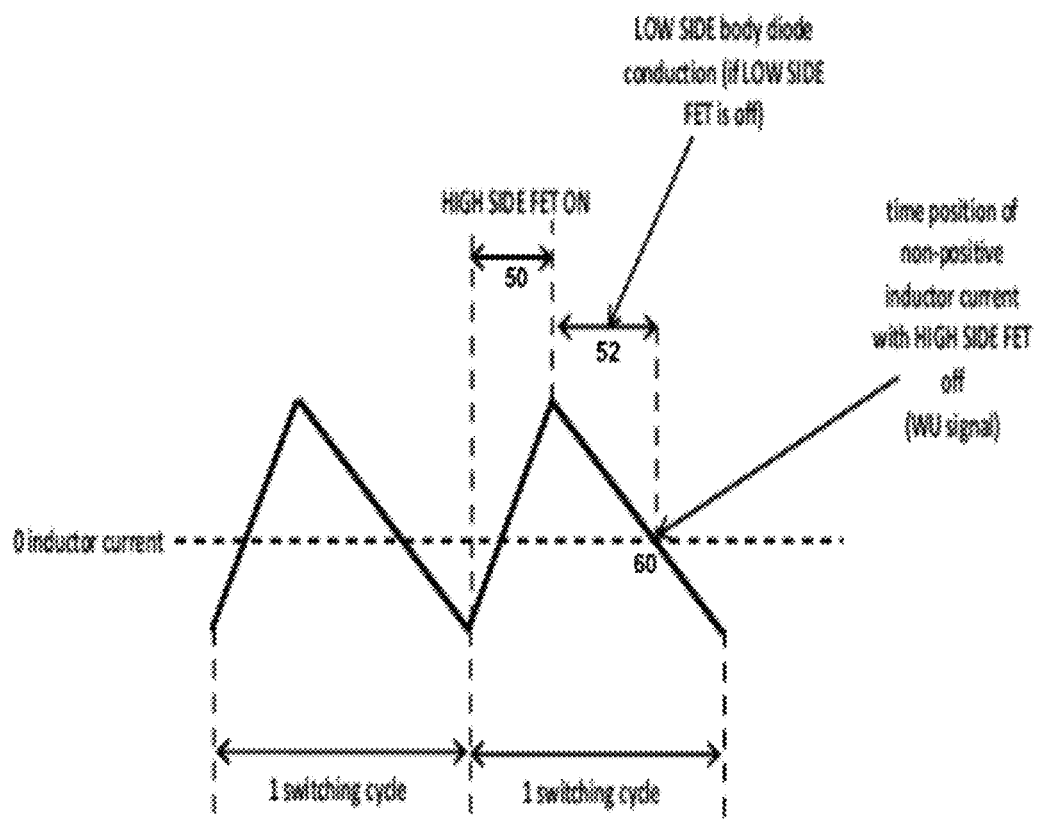
FIG. 2A shows an exemplary graph of inductor current during a discontinuous mode operation.

FIG. 2A shows an exemplary inductor current during a discontinuous mode of operation. As shown in FIG. 2A, in a switching cycle, the High Side power transistor is on for period 50, followed by a Low Side body diode conduction period 52 if the Low Side power transistor is off.

The ANPICD determines the WU signal, which is defined as the condition when the High and Low Side power transistors are off and the positive going voltage at the switch node output of the switching regulator (resulting from negative or zero inductor current or regulated output voltage) exceeds a threshold voltage. Once the WU signal is detected, regulator efficiency is improved by shutting off the Low Side power transistor.

The WU signal can be detected starting at time position 60 of FIG. 2A. The Low Side power transistor body diode conducts (if the Low Side power transistor is off), during the time that the inductor current is POSITIVE. If the Low Side power transistor is turned on for the period of time that the Low Side power transistor body diode would conduct and the Low Side power transistor is turned off at the inductor current zero cross point, then the regulator will be operating at optimal efficiency. The WU signal can be generated anytime the Low and High Side power transistors are off and the inductor current is non-positive. The time position of the start of the WU signal, relative to when the High Side power transistor shuts off, is an accurate gauge of how long the Low Side power transistor should stay on in order to operate most efficiently.

The ANPICD uses the time position of the start of the WU signal to adapt an integrator that controls when the Low Side power transistor turns off. Each switching cycle the ANPICD looks to see if a WU signal occurs within a short (for example 10 ns) time window of when the Low Side power transistor turns off. This time qualified WU signal is called a WILE signal. If a WILE signal occurs, then the timer is adjusted to turn the Low Side power transistor off a little sooner (for example 1/10 of a switching cycle), thereby increasing the dead time. This process continues until the Low Side power transistor is turned off just before the start of the WU signal and before the WILE signal occurs. At this point, the ANPICD detects the lack of a WILE signal and adjusts the timer to turn off the Low Side power transistor a little later (for example 1/10 of a switching cycle) thereby decreasing the dead time. The timer continues to turn off the Low Side power transistor a little later until once again a WILE signal is generated or the timer saturates. If the integrator saturates, the turn off of the Low Side power transistor is controlled by the switching regulator controller, as it seeks to hold the output voltage a constant. In fact the turn off of the Low Side power transistor is controlled either by the switching regulator controller or the ANPICD whichever shuts off the Low Side power transistor first.

Figure 2B:
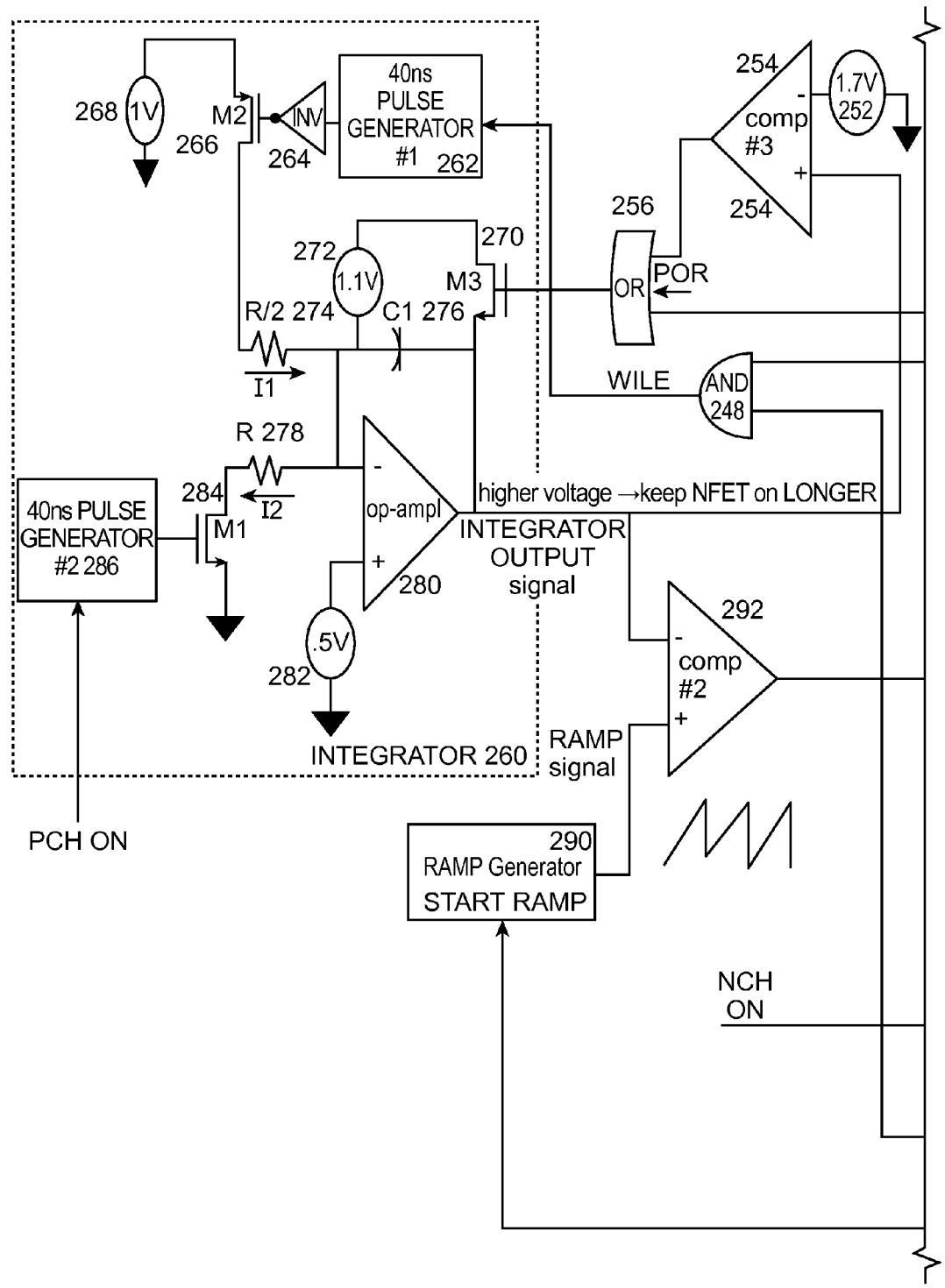
FIG. 2B shows an exemplary analog ANPICD embodiment.
Figure 2B:
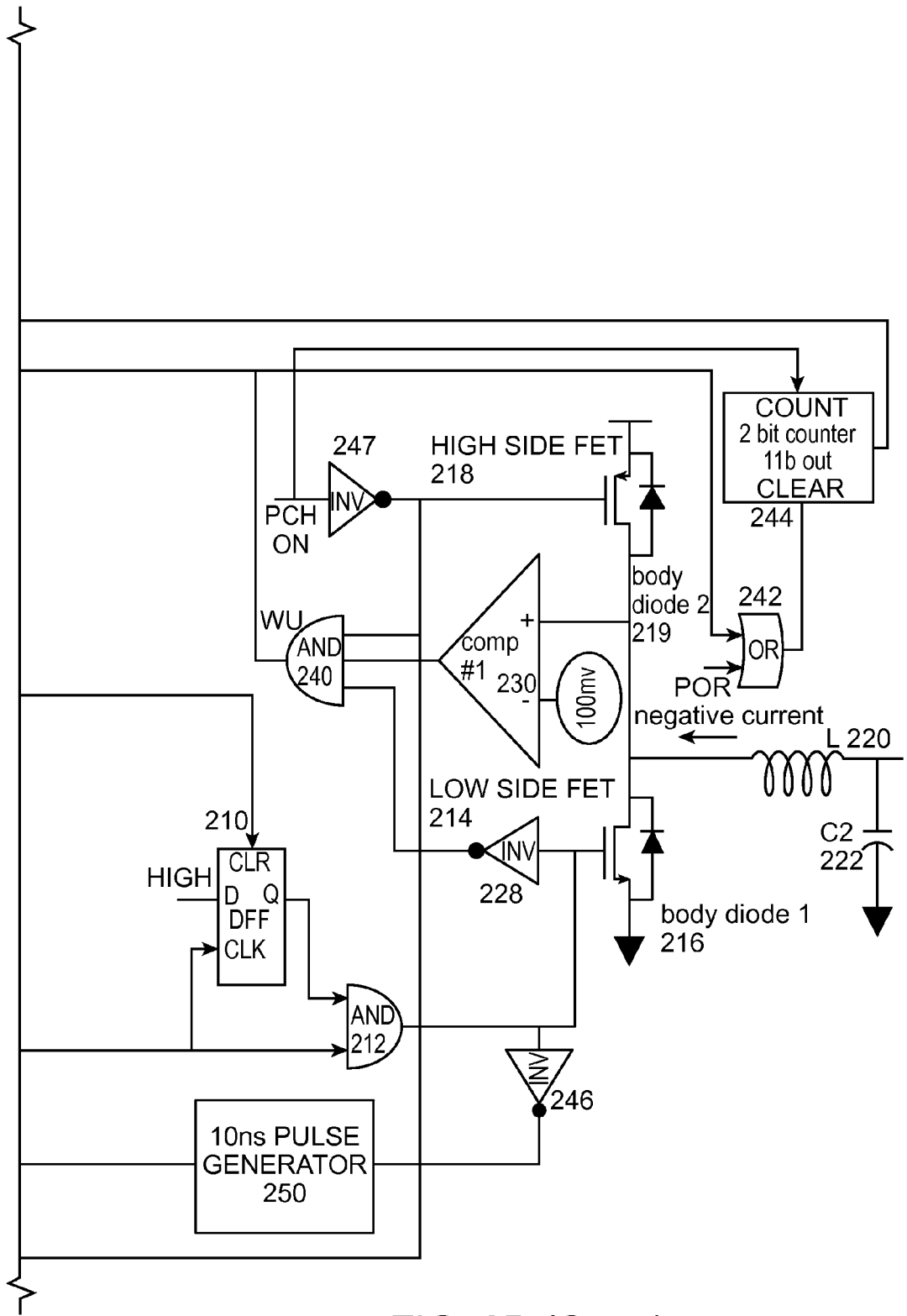
Figure 3:
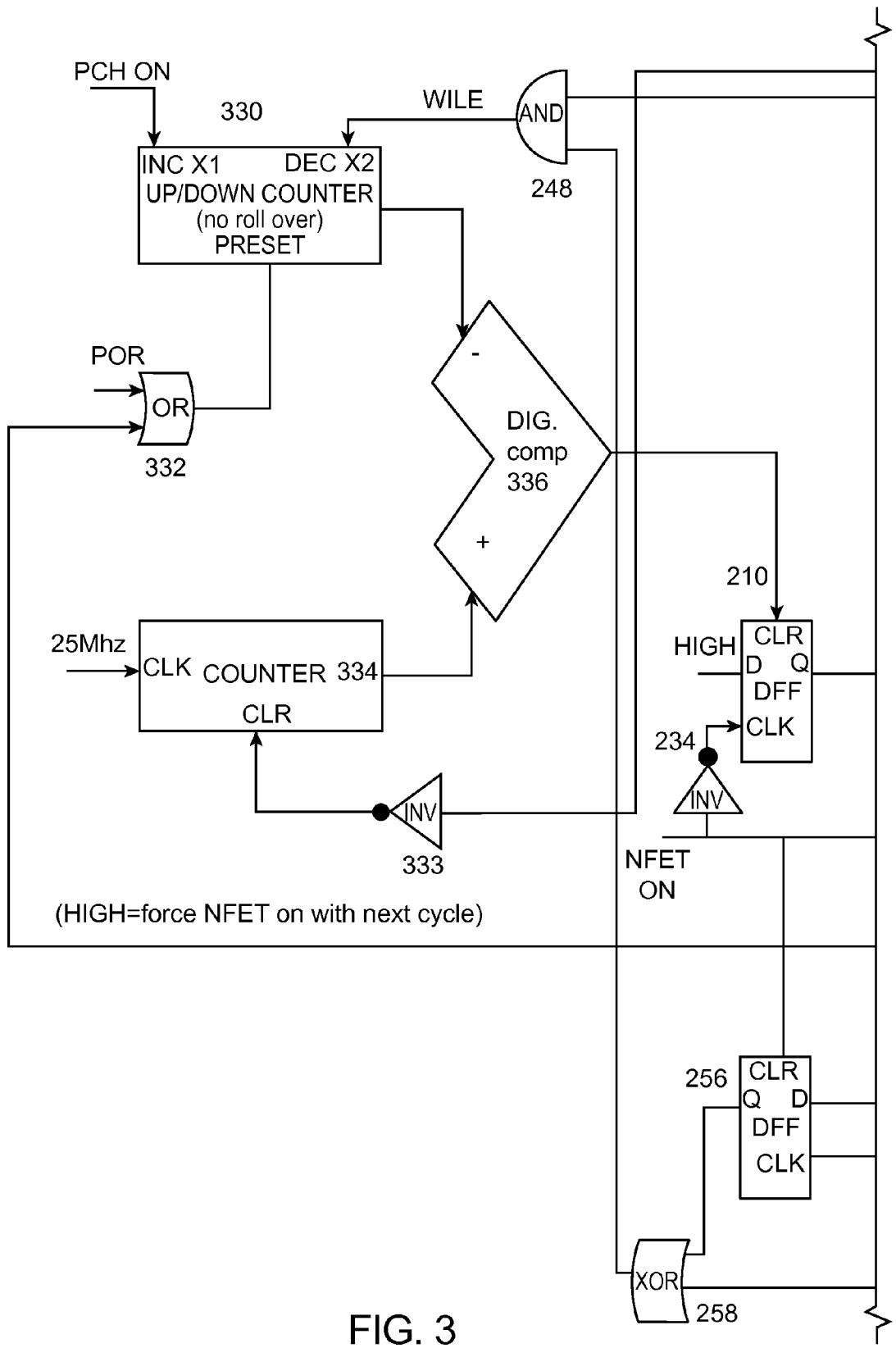
FIG. 3 shows an exemplary digital ANPICD embodiment.
Figure 3:
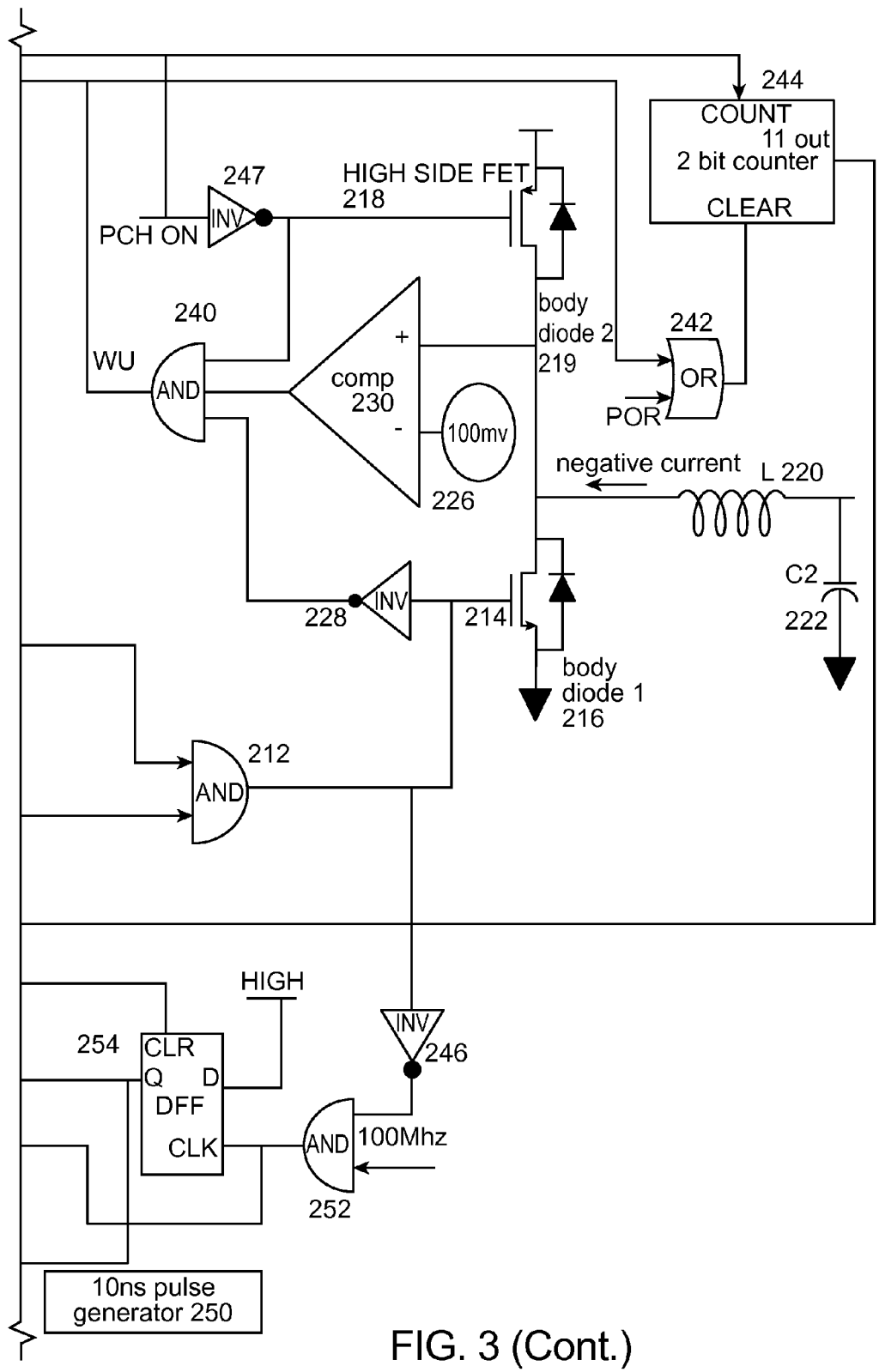

Various techniques can be used to implement the ANPICD, but for purposes of illustration, an analog implementation will be shown in FIG. 2B and a digital implementation will be shown in FIG. 3.

FIG. 2B shows one implementation of ANPICD in accordance with the invention. The ANPICD implementation of FIG. 2B contains as major blocks the following: circuitry to detect the WU signal; circuitry to generate the WILE signal; an integrator; a timer; and a comparator.

Referring now to FIG. 2B, an inductor 220 is connected at a junction between a Low Side power transistor 214 and a High Side power transistor 218 (Bao: please make all the numbers larger and BOLD). A capacitor 222 is connected to the other end of the inductor 220. The Low Side power transistor 214 has a body diode 216, while the High Side power transistor 218 has a body diode 219. Periodically, the inductor 220 provides a negative current that is sensed by a comparator 230 that checks the output voltage against a reference source 226. The comparator 230 is connected to an AND gate 240 outputting a WU signal. The AND gate 240 is also connected to the gate of High Side power transistor 218 (PCH_ON bar signal) as well as the output of inverter 228. The inverter 228 is connected to the gate of the Low Side power transistor 214, which is driven by AND gate 212. A flip-flop 210 is cleared by the output of comparator 292 and is set by NCH_ON. The flip-flop 210 provides the output to the AND gate 212 to turn on or off the Low Side power transistor 214.

The WU signal detection circuitry detects the condition when the High Side power transistor 218 and Low Side power transistor 214 are off and the voltage at the switch node output (resulting from negative inductor current or the regulated output voltage) exceeds a threshold voltage (shown in one embodiment as 100 mv at the input to comparator 230) or a predetermined voltage range (in this case a 100 mv range). The WU signal from AND gate 240 and power on reset POR are provided to an OR gate 242 which is connected to the clear input of a counter 244. The count input is the PCH_ON signal, which is also provided to an inverter 247. The output of inverter 247 drives the gate of High Side power transistor 218 and also the AND gate 240.

The WU signal is also provided to one input of an AND gate 248 generating a WILE signal, with the other input connected to the output of a pulse generator 250. The generator 250 operates in response to the output of an inverter 246 connected to the AND gate 212.

To generate the WILE signal, in each switching cycle the ANPICD looks to see if a WU signal occurs within a short (such as a 10 ns pulse) time window of when the Low Side power transistor 214 turns off. This time qualified WU signal is called a WILE signal. In one embodiment, a 10 ns pulse generator 250 is triggered at the turn off of the Low Side power transistor. The output of the 10 ns pulse generator is "AND'd" with the WU signal to generate the WILE signal. The WILE signal is one input to the integrator block 260. Each time a WILE signal occurs the voltage at the output of the integrator 260 decreases a small amount (for example, it may take 10 WILE signals in a row to move the integrator output from its most positive output to its most negative output). The amount of decrease in the integrator output is one component that determines the rate of adaptation as well as the time resolution of the Low Side power transistor 214 on time. The greater the amount of decrease, the faster the adaptation, but the lower the resolution of the conduction of the Low Side power transistor 214 with respect to time. The presence of the WILE signal indicates that the Low Side power transistor 214 is turned on too long (thereby generating non-positive current). The lack of a WILE signal indicates that Low Side power transistor 214 may need to be turned on longer.

An integrator 260 is also implemented. The integrator 260 receives the output of an OR gate 256 which goes HIGH when the POR (power on reset) signal, the 11b_bar output of the counter 244, or the output of a comparator 254 goes HIGH. The high output of OR gate 256 resets the integrator 260 to its maximum output level, thereby forcing control of the low side power transistor 214 to the NCH_ON signal. Once integrator 260 is reset, the ANPICD will re-adapt to set the optimal timing control of the turn off of the low side power transistor 214. The integrator 260 output level is a measure of the relative duration for turning on the NFET for optimal efficiency. The comparator 254 checks a reference source voltage 252 against the output of integrator 260 to determine if the integrator 260 has saturated. The high output of comparator 254 and OR gate 256 will reset integrator 260 to its maximum non-saturated output level.

During operation, the WILE signal is provided to a pulse generator 262, which generates 40 ns pulses in one embodiment. The pulse generator 262 drives an inverter 264 which controls the gate of FET M2 266. The FET M2 266 receives power from a voltage source 268, and is connected to a resistor 274. The resistor 274 is connected to a 1.1V source 272, which in turn is connected to a FET M3 270. The output of the OR gate 256 is provided to the gate of the FET M3 270. A capacitor 276 is connected between the resistor 274 and a second end of the FET M3 270 and the output of an op-amp 280. The op-amp 280 receives at the positive terminal a voltage reference 282 (0.5V in this embodiment) and generates an integrator output voltage. The higher the output of the integrator 260, the longer the NFET should be turned on.

The PCH_ON signal is used to trigger another pulse generator 286 (in this case a 40 ns pulse generator). The pulse is provided to the gate of a FET M1 284. One end of the FET M1 284 is grounded, while the other end is connected to a resistor 278. The resistor 278 has a resistance that is twice the value of the resistor 274.

The change in the output voltage of the integrator 260 is a measure of the adaptation process. A steady state integrator output voltage indicates adaptation is complete. The integrator 260 produces a DC voltage that is compared against a timer/RAMP signal. As long as the RAMP signal is less than the integrator output signal the Low Side power transistor 214 on time is controlled by the NCH_ON signal. A WILE signal causes a small decrease in the integrator output voltage by activating the 40 ns pulse generator #1 262. The 40 ns output pulse turns on PFET M2 266 which applies 1V to one side of the resistor 274 with R/2 resistance. The 1V generates a current, I1, given by Equ. #1 and a corresponding decrease in the integrator output signal given by Equ. #2:

$$I1=(1V-0.5V)/(R/2)=1/R \qquad \text{Equ. \#1}$$

$$\text{delta}_{INTEGRATOR\ OUTPUT}\text{signal}=-(I1/C1)*40\ ns=(-1/RC1)*40\ ns \qquad \text{Equ. \#2}$$

Each time the High Side power transistor 218 turns on, the PCH ON signal activates the 40 ns PULSE GENERATOR #2 286 which turns on NFET M1 284 for 40 ns. If M1 is on, one side of the R value resistor 278 is connected to ground which generates a current I2 (given by Equ. #3) and a corresponding change in the integrator signal (given by Equ. #4).

$$I2=0.5V/R \qquad \text{Equ. \#3}$$

$$\text{delta}_{INTEGRATOR\ OUTPUT}\text{signal}=(I2/C1)*40\ ns=(0.5/RC1)*40\ ns \qquad \text{Equ. \#4}$$

The change in the integrator signal given in Equ. #2 is twice that given in Equ. #4. This is necessary to insure that the integrator output voltage can be made to have a net decrease as a PCH ON signal can occur every cycle while a WILE signal may not. It is certainly possible (with a different integrator implementation than shown in FIG. 2B) to have equal "delta$_{INTEGRATOR\ OUTPUT}$" signals, however, this requires qualifying the input to the 40 ns PULSE GENERATOR #2 286 with additional logic that determines if the WILE signal occurs during a switching cycle.

Various different implementations of the integrator block 260 can be used, including purely digital implementations as well as switched capacitor implementations. However, the essential characteristic of all these implementations is that there are at least two inputs wherein each input causes a "delta$_{INTEGRATOR\ OUTPUT}$" opposite in direction of the other input. The initialization of the integrator 260 needs to be provided. The integrator is initialized immediately after a power on reset (POR, which occurs when the circuit is first powered up) as well as a short period of time after the absence of consecutive WU signals.

In the ANPCID implementation shown in FIG. 2B, the integrator 260 output is initialized to its maximum output if a WU signal is absent for two consecutive switching cycles (the number of switching cycles being determined by the 2 bit counter in one embodiment). The integrator reset has the effect of immediately allowing the NCH ON signal full control over the Low Side power transistor 214. In so doing, there is an improvement in efficiency.

The integrator 260 can be reset if the integrator output exceeds a predefined threshold (as set by the voltage on the positive input to Comparator #3 254). This prevents the op-amp 280 from saturating, thereby guaranteeing proper integrator functionality.

Turning now to the timer circuit, a ramp generator 290 receives a start ramp signal from the inverter 247 generating the PCH_ON bar signal. The ramp output is supplied to one input of a comparator 292, while the other input is the output of the integrator 260. The output of the comparator 292 is provided to the clear/reset input of the flip flop 210. When cleared, flip flop 210 turns off the low side power transistor 214.

As soon as the High Side power transistor 218 turns off the RAMP Generator 290 produces a RAMP signal. This signal is responsible for providing a time base to Comparator #2 292, which then compares the RAMP to the integrator output signal. As long as the integrator output signal is greater than the RAMP signal, the Low Side power transistor 214 is controlled by the NCH ON signal. When the RAMP signal exceeds the integrator output signal the DFF 210 is cleared and the Low Side power transistor 214 shuts off. Thus the RAMP signal provides a means to set the turn off time position of the Low Side power transistor 214. This time position is adaptively controlled by the ANPICD.

The comparator 292 compares the timer signal (RAMP Generator output) to the integrator output signal so as to determine the point in time to disable the Low Side power transistor 214. In a purely digital implementation of the ANPICD this comparator could be a digital comparator and the RAMP generator/timer could be a digital counter, counting a fixed clock frequency.

During buck regulation, where there is only positive current in the inductor 220, during the time between when the Low Side power transistor 214 turns off and the PFET 218 turns on (i.e. the "dead time") the output voltage at the switch node (i.e. the drains of the PFET and NFET) goes negative as body diode 216 continues to conduct the positive going current. With the switch node negative, the comparator 230 output is LOW, as is the output of AND 240 (WU signal).

The signal detected by the comparator 230 is a very large signal near the supply rail. This large overdrive quickly moves the comparator output and swamps out any offsets in the comparator. Another case to consider is light load continuous operation wherein the current in the inductor transitions from a positive to a negative current part way through a switching cycle. This might happen, for example, if there is little or no load on the buck regulator output. In this circumstance, immediately after the High Side power transistor 218 turns off and before the Low Side power transistor 219 turns on, the voltage at the switch node output goes negative as body diode 216 continues to conduct the positive inductor current initiated when the High Side power transistor 218 was on. If the Low Side power transistor 214 turns on, the current decays and turns negative which will then be detected (as a WU signal) at the end of the switch cycle (i.e. when the Low Side power transistor 214 turns off). If the WU occurs within 10 ns of the Low Side power transistor 214 turn off, then a WILE signal is generated. The WILE signal then forces the Low Side power transistor 214 to turn off sooner on the next switching cycle. WILE signals generated on subsequent switching cycles cause the adaptation to turn off the Low Side power transistor 214 sooner in the switching cycle. This process continues until the WILE signal is no longer generated, at which point the adaptation turns on the Low Side power transistor 214 later in the switching cycle. Turning on the Low Side power transistor 214 later in the switching cycle may again result in the generation of a WILE signal at which point the ANPICD reaches a quasi-stable state wherein WILE signals are generated on a periodic basis, dithering the turn off time of the Low Side power transistor 214. When transitioning from light load to heavy loads the Low Side power transistor 214 will transition from being disabled to enabling every cycle automatically. As current increases in the inductor the operation moves from discontinuous conduction mode to continuous conduction mode. This becomes the case where there is only positive current in the inductor. In this circumstance, body diode 216 conducts current for the entirety of the dead time and the WU signal is never asserted. The lack of a WU signal also means a lack of the WILE signal. In the absence of a WILE signal the ANPICD will keep the Low Side power transistor on for more of the switching cycle. This happens as the INTEGRATOR 260's output increases each switching cycle, which in turn causes comparator 292's output to assert at later times in the switching cycle (i.e. at higher RAMP 290 voltages). Though the previous examples have illustrated the operation of the ANPICD detector with negative current, the ANPICD does not require negative current to detect when to turn off the NFET. For example, in the no or light load circumstance when the High Side power transistor 218 is turned off and the Low Side power transistor 214 has been held off by the ANPICD, the voltage at the switching node does not necessarily swing sufficiently positive to turn on body diode 219. In this circumstance the voltage at the switch node is driven to the output voltage of the buck regulator though the inductor (after the positive current from the PFET being on decays in the inductor).

The switch node can exhibit "ringing" due to the resonance of the output inductor and the stray capacitance at the switch node. However, the center point of the ringing is equal to the buck regulator output voltage. This occurs as an ideal inductor cannot sustain a DC voltage across it. In any case, this voltage is sufficiently positive to provide a large amount of over drive to the comparator and provide a valid WU signal.

In the discontinuous mode operation, the time position of the non-positive current in the inductor begins at some fraction of the switching cycle when the High Side power transistor 218 is off. The ANPICD of FIG. 2B performs the detection of the WU signal defined as the condition when the High Side power transistor and Low Side switch node output of the switching regulator (resulting from either negative or positive inductor current or the regulated output voltage) exceeds a threshold voltage or a predetermined voltage range. Once WU is detected, which in the example of FIG. 2A begins at position 60, regulator efficiency is improved by shutting off the Low Side power transistor for some portion of the switching cycle.

In the discontinuous mode of operation, the NPICD operates to hold off the Low Side power transistor 214 for the entirety of the switching cycle. This means that the body diode of the Low Side power transistor will conduct current for a portion of the cycle. This body diode conduction introduces some power loss as given by the product of the current through the body diode times the forward diode voltage drop. A more optimal solution would act to turn on the Low Side power transistor for the portion of the cycle the inductor current is positive, and to turn off the Low Side power transistor when the inductor current reaches zero. This enhanced operation is achieved in the ANPICD of FIG. 2B and FIG. 3.

Next, simulation results on the circuit of FIG. 2B will be discussed. An analog model of the circuit of FIG. 2B was simulated with a SPICE circuit simulator and selected waveforms from the simulation are shown in FIG. 2C and FIG. 2D.

For the simulation, the HIGH and Low Side power transistors 218 and 214 are driven with a ~50% duty cycle PWM signal that in conjunction with the 5V power rail produce a steady state regulator output voltage of ~2.5V. A 1 ohm load resistor is placed across C2 222 which draws ~2.5 A of current from the switching regulator. An ideal piece wise linear current source is connected to this load resistor. This current source provides a means to dynamically change the current in the output inductor (i.e. to generate non-positive current in the inductor). For example if the current source drives 4A of current into the load resistor then the direction of the current in the inductor will change from positive to negative.

Figure 2C:
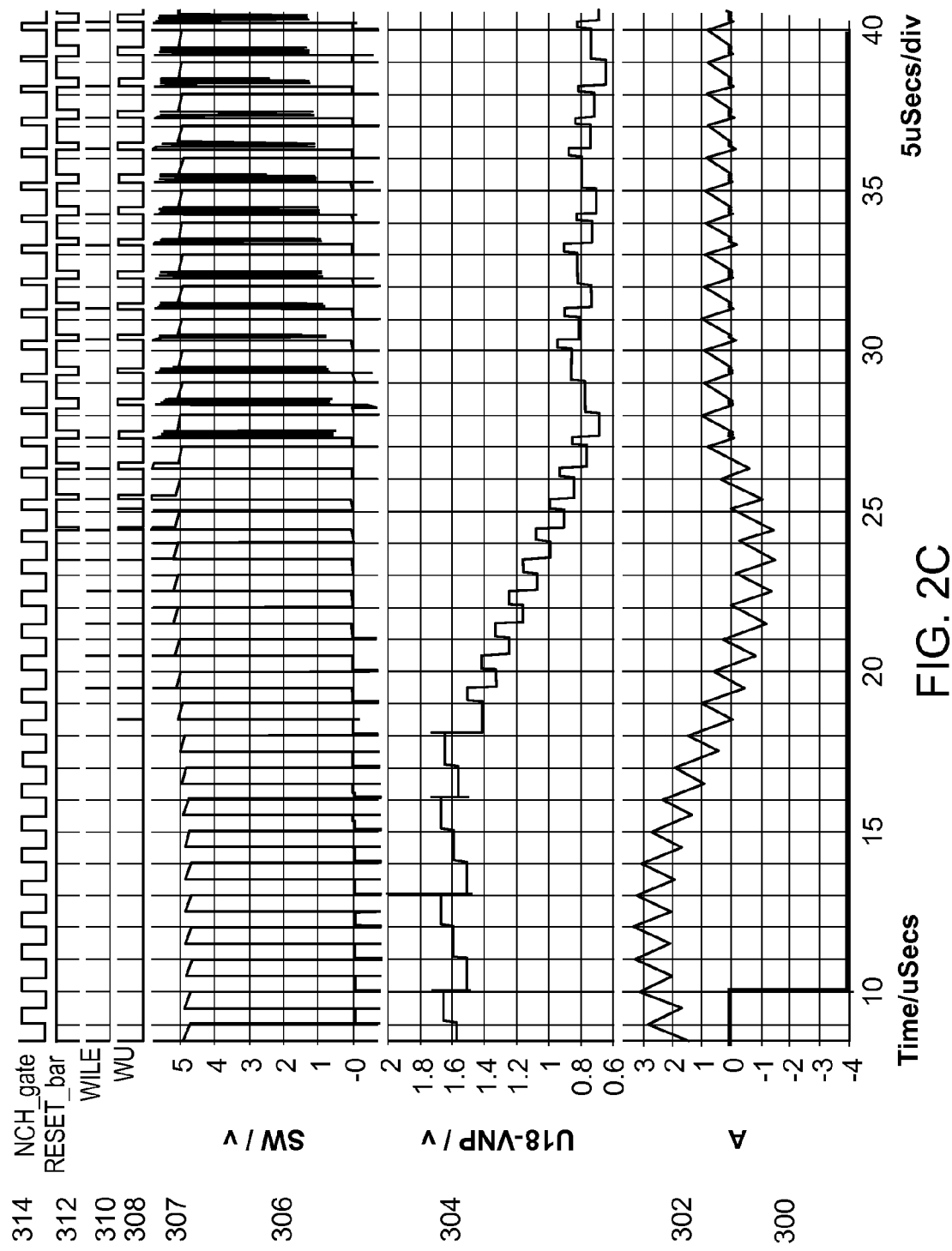
FIG. 2C shows exemplary simulated waveforms at various nodes in the analog ANPICD of FIG. 2B.
Figure 2D:
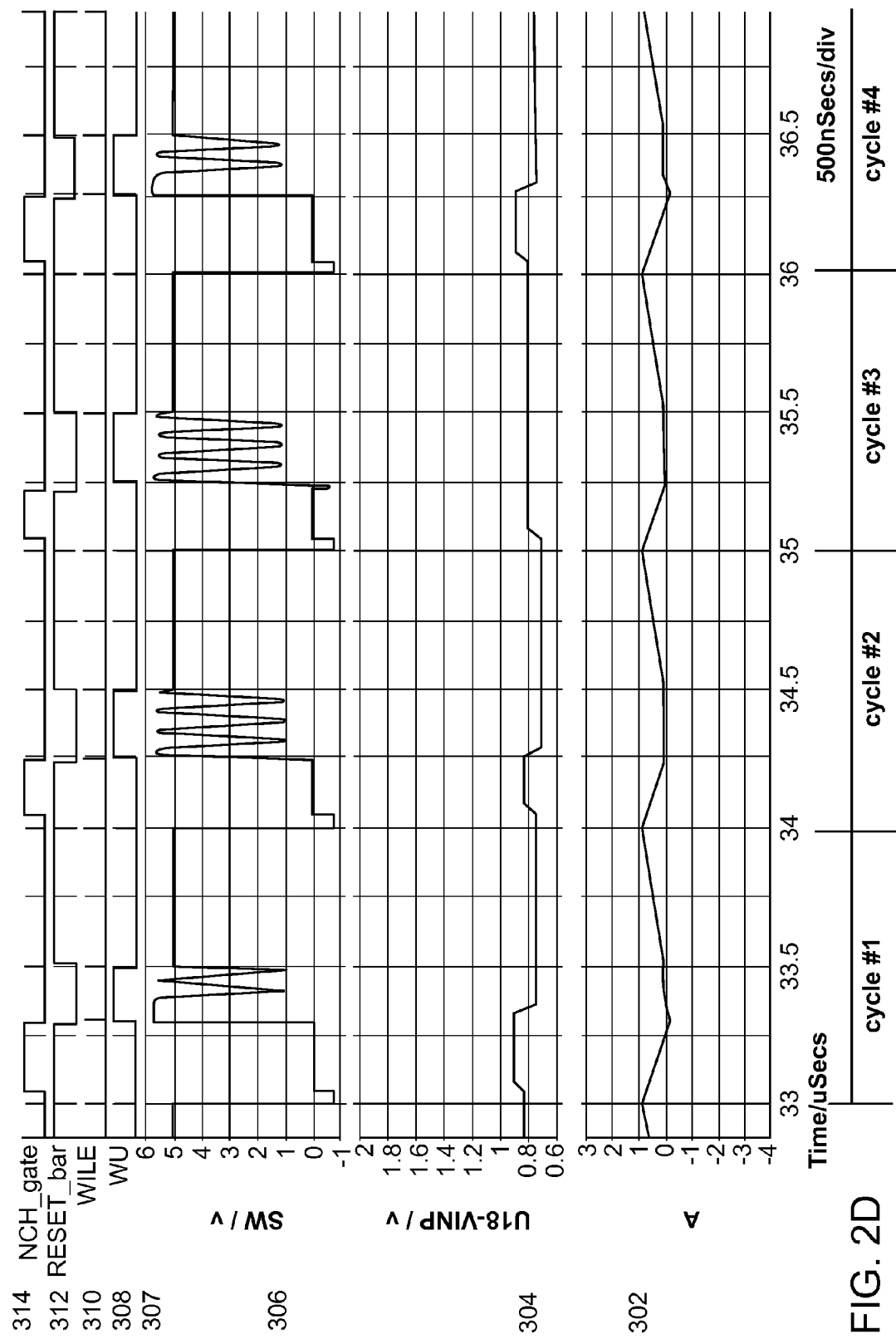
FIG. 2D shows in more details portions of the waveforms of FIG. 2C.

Turning now to FIG. 2C, signal 300 is the current waveform of an ideal current source which was used to dynamically change the current in the inductor. The current starts at 0 which means the inductor current is ~2.5 A. Then at 10 us the current source drives 4A of current to the output of the switching regulator. This has the effect of reversing the current in the output inductor signal 302, which hits zero at ~18.5 us.

FIG. 2C shows a signal 302 representing the current in the output inductor. When this current goes to zero at ~18.5 us, the WU signal 308 is active. Adaptation starts to happen with the first WILE signal 310 at 19.5 us, as evidenced by the decrease in voltage of the integrator output signal 304. When the adaptation settles out at ~27 us the inductor current no longer goes negative because of the action of the ANPICD.

The integrator output signal 304 is one of the key signals in the adaptation process. The signal starts off at a high voltage which allows full control of the Low Side power transistor with the NCH ON signal. When WILE signal 310 occurs the integrator output starts to drop. The integrator output never exceeds 1.7V due to the integrator reset that occurs via comparator 254. At each switching cycle the integrator output signal increases then decreases. This initial increase is due to the firing of the 40 ns pulse generator 286.

FIG. 2C also shows a signal 306 which represents the signal at the switching node between the HIGH and Low Side power transistor. When adaptation has settled out (after about 29 us), the switching node voltage only goes below ground potential for very short durations (i.e. the Low Side power transistor body diode 216 only conducts for short durations). This is because the on time of the Low Side power transistor has been adjusted by the adaptation to turn on for a portion of the switching cycle, thereby shorting out the body diode 216. Had the Low Side power transistor 214 been simply shut off (as would have been the case with the NPICD), the body diode of the Low Side power transistor 216 would have conducted more current, with a corresponding loss in efficiency.

Observation of the NCH_GATE signal 314 shows the shorter duration of the on time for the Low Side power transistor 214 (as a result of the adaptation). Immediately after the Low Side power transistor 214 turns off, a WU signal 308 is generated and occasionally a WILE signal 310 is generated. Once the ANPICD adapts, there is a natural cycling of the adaptation voltage which gets pumped up on every switching cycle and then pumped down by the presence of a WILE signal 310. The observed ringing of the switching node after the Low Side power transistor 214 turns off is due to the resonance formed by the output inductor 220 in combination with the stray capacitance at the switching node.

The WU signal 308 is generated every cycle that the inductor current is either zero or negative. The WILE signal 310 is a short pulse that only occurs when the WU signal 308 is sufficiently close to the time at which the Low Side power transistor signal 314 turns off. A signal 312 represents the inverted output of COMP 292. When this signal goes LOW the DFF (D input flip flop) 210 of FIG. 2B is cleared. When this flip flop 210 is clear the NCH ON signal cannot turn on the Low Side power transistor 214. This signal is controlled by the adaptive loop. The signal 314 represents operations at the gate of the Low Side power transistor 214. When the signal 314 is HIGH, the Low Side power transistor is on. The on time is shortened as the adaptation settles out (after ~25 us). If this was a simulation of the NPICD, the Low Side power transistor 214 would be completely off for the period of time that the inductor current goes to zero or negative.

FIG. 2D shows a zoomed in portion of the waveforms shown in FIG. 2C. These waveforms more clearly illustrate the adaptive process and the cycling of the adaptation voltage through Cycles 1-4. In Cycle 1, the presence of the WILE signal 310 indicates that the Low Side power transistor 214 is on too long. This is also evidenced by the small amount of negative inductor current in signal 302. The WILE signal 310 reduces the integrator output signal 304 a small amount.

In Cycle 2, relative to the width of the gate signal 314 in cycle 1, the width of the gate signal 314 in cycle 2 has been decreased. Thus the low side power transistor in cycle 2 is on for less time than in cycle 1. Nonetheless a WILE signal 310 is still generated indicating that the on time of the Low Side power transistor 214 should be further reduced.

In Cycle 3, once again the on time of the Low Side power transistor 214 is reduced as compared to the previous cycle. In this, however, the on time is reduced too much. This is evidenced by the second small negative undershoot of the signal 306 at the switching output node waveform. This small negative undershoot is a result of conduction of the Low Side power transistor body diode. The WILE signal is inactive in cycle 3, which results in a small increase in the integrator output voltage 306. This small increase extends the signal 314 on time of the Low Side power transistor 214 in Cycle 4.

In Cycle 4, the above sequence starts to repeat. This sequence will continue to repeat until the output load changes forcing a new adaptation.

FIG. 3 illustrates one exemplary digital implementation of an ANPICD. All the essential elements are still present though many have now been implemented digitally. The circuit to detect the WU signal is the same as shown in FIG. 2B. In generating the WILE signal, the 10 ns pulse generator 250 has been implemented digitally as a combination of two DFFs 254-256 and an XOR gate 258. The input to the DFF 254 is an AND gate 252 which receives a 100 MHz input clock and the output of the inverter 246. When the NFET ON signal goes low the output of the XOR gate 258 is a 10 ns pulse. This pulse is AND'd with the WU signal through the AND gate 248 to generate the WILE signal.

The integrator is now implemented with an UP/DOWN counter 330. The counter 330 is incremented by one each time the PCH ON signal goes HIGH and is decremented by two each time there is a WILE signal. The amount by which the counter 330 is incremented each PCH ON and decremented each WILE, determines the rate of adaptation as well as the resolution of the timing of the control of the Low Side power transistor. The PRESET function initializes the integrator prior to the start of adaptation or after two switching cycles without a WU signal.

The timer is implemented as a counter 334 which is reset to 0 each time the PCH ON signal goes LOW. The rate at which this counter is incremented is one element that determines the resolution of the timing of the Low Side power transistor. For example, with a 25 Mhz clock the time position of the adapted Low Side power transistor control will be accurate to within ½5 Mhz=40 ns.

A digital comparator 336 generates a HIGH output if the COUNTER output exceeds the output of the UP/DOWN COUNTER (i.e. integrator). When the comparator 336 output is HIGH, the Low Side power transistor 214 is turned off (because flip flop 210 is cleared).

Although the examples given above describe current detector circuits, one skilled in the art will appreciate that the technique can be applied to other circuit functions for operation in similar fashion. It will be understood from the foregoing description that various modifications and changes may be made in the preferred and alternative embodiments of the present invention without departing from its true spirit. For example, the power transistors may be implemented using MOS transistors, bipolar transistors, or other suitable switching devices, the circuit may include a subset or superset of the elements described in the examples above, the method may be performed in a different sequence, the components provided may be integrated or separate, the devices included herein may be manually and/or automatically activated to perform the desired operation.

This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. An adaptive current detector for an output inductor from a switched voltage output of a switching regulator, comprising
   a. a high side power transistor;
   b. a low side power transistor;
   c. an inductor coupled to the high and low side power transistors;
   d. a detector asserting a first signal indicating when the high and low side power transistors are off and an inductor current is non-positive, wherein the detector asserts a second signal when the first signal is asserted within a predetermined period of when the low side power transistor turns off, and wherein the second signal is used in an adaptive loop to adjust when the low side transistor is turned off.

2. The adaptive current detector of claim 1, wherein the detector adapts an on-time of the low side power transistor in response to a current in the inductor.

3. The adaptive current detector of claim 2, wherein a low side power transistor on-time is adjusted by the adaptive loop to improve switching regulator efficiency.

4. The adaptive current detector of claim 2 wherein the detector provides a means to accurately detect when the inductor current reaches zero during the switching cycle.

5. The adaptive current detector of claim 1, wherein the second signal is generated by a logic gate coupled to the first signal and a pulse generator supplying a pulse width for the predetermined period.

6. The adaptive current detector of claim 1, comprising an integrator coupled to the second signal and to the low side power transistor to control when the low side power transistor turns off, wherein the integrator reduces or increases an output voltage or digital count when each second signal is asserted.

7. The adaptive current detector of claim 6, wherein the integrator comprises an operational amplifier.

8. The adaptive current detector of claim 6, wherein the integrator comprises an up/down counter.

9. The adaptive current detector of claim 1, comprising a timer coupled to the low side power transistor to incrementally adjust when the low side power transistor is turned on or off.

10. The adaptive current detector of claim 9, wherein the timer comprises a ramp generator.

11. The adaptive current detector of claim 9, wherein the timer comprises a counter.

12. The adaptive current detector of claim 1, comprising a comparator to turn off the low side power transistor.

13. The adaptive current detector of claim 12, wherein the comparator comprises a counter coupled to a timer having a timer count output and wherein the comparator turns off the low side power transistor when the timer counter output exceeds the count output.

14. The adaptive current detector of claim 12, comprising logic coupled to the comparator output, controlling the turn on and turn off of the low side power transistor.

15. A current detector for an output inductor, comprising
a. a high side power field effect transistor (FET);
b. a low side FET coupled to the high side FET;
c. means for asserting a first signal indicating when the high and low side power transistors are off and an inductor current is non-positive;
d. means for asserting a second signal when the first signal is asserted within a predetermined period of when the low side power transistor turns off; and
e. an adaptive loop using the second signal to adjust when the low side transistor is turned off.

16. The detector of claim 15, comprising:
a. means for integrating the output of said means for asserting the second signal;
b. timer means for incrementally adjusting when the low side power transistor is turned on or off; and
c. means for comparing the integrating means with the timing means and turning off the low side power in response to the comparing means.

17. An adaptive current detector for an output inductor from a switched voltage output of a switching regulator, comprising
a. a high side power transistor;
b. a low side power transistor;
c. an inductor coupled to the high and low side power transistors;
d. a detector asserting a first signal indicating when the high and low side power transistors are off and an inductor current is non-positive; and
e. a controller coupled to the detector and the high and low side power transistors to provide cycle by cycle conduction of the low side power transistor, the controller turning off the low side power transistor when the first signal is asserted within a predetermined period when the low side power transistor turns off.

18. The detector of claim 17, wherein the controller asserts a second signal when the first signal is asserted within a predetermined period when the low side power transistor turns off.

19. The detector of claim 17, wherein the controller adaptively turns off the low side power transistor in response to a time position of the first and second signals.

20. The detector of claim 17, further comprising:
a. a detector to determine when the controller is active within a predetermined period when the low side power transistor turns off;
b. an integrator coupled to the detector;
c. a timer to incrementally adjust the timing when the low side power transistor is turned on or off; and
d. a comparator coupled to the timer and the integrator, wherein the comparator output turns off the low side power transistor.

* * * * *